US008721906B2

(12) United States Patent
Hambek

(10) Patent No.: US 8,721,906 B2
(45) Date of Patent: May 13, 2014

(54) METHOD TO INCREASE YIELD AND REDUCE DOWN TIME IN SEMICONDUCTOR FABRICATION UNITS BY PRECONDITIONING COMPONENTS USING SUB-APERTURE REACTIVE ATOM ETCH

(75) Inventor: Wayne Hambek, Frisco, TX (US)

(73) Assignee: Poco Graphite, Inc., Decatur, TX (US)

( * ) Notice: Subject to any disclaimer, the term of this patent is extended or adjusted under 35 U.S.C. 154(b) by 307 days.

(21) Appl. No.: 12/997,205

(22) PCT Filed: Jun. 2, 2009

(86) PCT No.: PCT/US2009/045897

§ 371 (c)(1),
(2), (4) Date: May 17, 2011

(87) PCT Pub. No.: WO2009/151994

PCT Pub. Date: Dec. 17, 2009

(65) Prior Publication Data

US 2011/0239429 A1    Oct. 6, 2011

Related U.S. Application Data

(60) Provisional application No. 61/059,928, filed on Jun. 9, 2008.

(51) Int. Cl.
*G01L 21/30* (2006.01)
*G01R 31/00* (2006.01)

(52) U.S. Cl.
USPC ............... 216/59; 216/67; 216/58; 134/147; 219/209

(58) Field of Classification Search
USPC ................ 216/58, 67; 134/147; 219/147
See application file for complete search history.

(56) References Cited

U.S. PATENT DOCUMENTS

| | | | |
|---|---|---|---|
| 5,403,399 A | 4/1995 | Kurihara et al. | |
| 5,937,878 A | 8/1999 | Cheng | |
| 6,130,397 A | 10/2000 | Arai | |
| 7,304,263 B2 | 12/2007 | Chang et al. | |
| 7,802,539 B2 | 9/2010 | Bosch | |
| 7,955,513 B2 | 6/2011 | Carr | |
| 8,142,845 B2 | 3/2012 | Rashed et al. | |
| 2003/0178049 A1* | 9/2003 | Yoon et al. | 134/147 |
| 2004/0173579 A1 | 9/2004 | Carr | |
| 2005/0106884 A1 | 5/2005 | Ren | |
| 2005/0244581 A1 | 11/2005 | Thebault et al. | |
| 2006/0045988 A1 | 3/2006 | Guo et al. | |
| 2008/0083425 A1 | 4/2008 | Carr | |
| 2008/0142055 A1* | 6/2008 | Yin et al. | 134/95.1 |

FOREIGN PATENT DOCUMENTS

| | | |
|---|---|---|
| JP | 01-197363 | 8/1989 |
| JP | 11-145148 A | 5/1999 |

(Continued)

OTHER PUBLICATIONS

Admitted prior art (pre Jun. 9, 2008).

*Primary Examiner* — Duy Deo
*Assistant Examiner* — Mahmoud Dahimene
(74) *Attorney, Agent, or Firm* — Christensen Fonder P.A.

(57) ABSTRACT

An embodiment of the present inventions provides a method for preconditioning a semiconductor fabrication component using a plasma etching process and an optional enhanced ultrasonic and/or megasonic preconditioning step in order to eliminate the need for a burn-in period typically associated with said components, as well as extend the useful life of the component during its wear-out phase.

11 Claims, 6 Drawing Sheets

(56) References Cited

FOREIGN PATENT DOCUMENTS

| JP | 2004-158226 | 6/2004 |
| JP | 2005-320236 | 11/2005 |
| JP | 2007035949 A * | 2/2007 | .......... H01L 21/3065 |
| JP | 2007-511911 A | 5/2007 |
| JP | 2008-047927 | 2/2008 |
| JP | 2008-053398 | 3/2008 |

* cited by examiner

METHOD TO INCREASE YIELD AND REDUCE DOWN TIME IN SEMICONDUCTOR FABRICATION UNITS BY PRECONDITIONING COMPONENTS USING SUB-APERTURE REACTIVE ATOM ETCH

CROSS REFERENCE TO RELATED APPLICATIONS

This application claims the benefit of U.S. Provisional Application No. 61/059,928, filed Jun. 9, 2008, the contents of which are incorporated herein by reference in their entirety.

BACKGROUND OF THE INVENTION

1. Technical Field of the Invention

The present invention relates to a method of reducing the down time associated with replacing graphite components of a semiconductor fabrication unit.

2. Background of the Invention

Carbon/Graphite is employed extensively in Ion Implant systems due to its inertness, its favorable electrical and mechanical properties, its benign chemical footprint, and its relative low cost when compared with refractory metals. A wide range of graphite grades with nominally acceptable properties are readily available in the market. All of these grades, however, share some characteristics that are detrimental to the process of implanting species onto silicon wafers. Constant bombardment with charged particles wears graphite components, degrading their ability to control the ion beam and leading to instability. The products of this wear mechanism are particles of graphite that can impact wafer yields.

The processes by which graphite implant components are manufactured involve mechanical grinding and milling shapes from larger blocks. These processes define physical features by mechanically breaking covalent bonds and liberating particles of graphite. The majority of these particles are transported away from articles in process through vacuum removal; however, a portion of the material is impacted into the porosity of the ceramic substrate. Consequently, there is a need to provide particle removal in excess of that removal achieved by employing conventional vacuum for smaller semiconductor devices.

In addition to the creation of particulates, mechanical stress imparted at the surface leaves sub-surface cracking, leaving particles with lower bond energy than that of the bulk. These two phenomena are believed to be causal to the high rate of particle liberation, and subsequent glitching and low wafer yields, seen in the early lifetime of implant components.

Anecdotal evidence from wafer fabrication users and equipment OEMs suggests that particulation from graphite components in the Implant system follows a 'bathtub' curve, That is, the number of particles generated early in the life of the components is high, then drops off to a constant, and finally increases exponentially as components reach wear out.

As various graphite components of the Implant system wear out, the manufacturer must shut down the process in order to replace the worn out parts. In order to increase the reliability of the replacement components, the replacement graphite components must go through a "seasoning" process in which the Implant system is operated with the plasma chamber empty for several hours. This requirement further increases the down time associated with the cycle of failure and replacement of graphite components.

Therefore, it would be beneficial for a method wherein the "seasoning" step could be eliminated. Furthermore, it would be beneficial for a method to provide a graphite component that had an increased useful life, which would in turn reduce down time associated with replacement of said part.

SUMMARY OF THE INVENTION

The present invention is directed to a process that advantageously addresses at least one of these needs. One embodiment of the present invention provides for a method for increasing the useful life of a graphite article to be used in processing equipment to manufacture semiconductor wafers. The embodiment generally includes placing a graphite or silicon carbide component within a plasma processing chamber having a plasma torch, and the plasma torch having a discharge. The graphite or silicon carbide component is then subjected to reactive atom plasma processing from the plasma torch such that substantially all graphite or silicon carbide particulates located on the surface and/or within the pores of the component are removed from the component.

In another embodiment of the present invention, a method for preconditioning the surface of a densified silicon carbide component is provided. This method includes placing the densified silicon carbide component within a plasma processing chamber having a plasma torch, and the plasma torch having a discharge. The densified silicon carbide component is then subjected to reactive atom plasma processing from the plasma torch such that substantially all silicon carbide particulates located on the surface and/or within the pores of the component are removed from the component. In this embodiment, the densified silicon carbide component is prepared by supplying a porous preform formed entirely from silicon carbide and having an open porosity, wherein the porous preform is formed from a near-net shape graphite article; filling a substantial number of pores within the porous silicon carbide preform with a carbon precursor to produce a filled silicon carbide preform; heating the filled silicon carbide preform at a preselected pyrolysis temperature to produce a carbonaceous porous structure within the pores of the porous silicon carbide preform; and contacting the carbonaceous porous structure with silicon so that the silicon diffuses through the carbonaceous porous structure and reacts with carbon contained within the pores of the porous silicon carbide preform to produce a second phase of silicon carbide within the pores of the porous silicon carbide preform, such that the resulting densified silicon carbide article is densified with silicon carbide and exhibits lower porosity compared to the porous silicon carbide preform and is a SiC—SiC composite.

In another embodiment of the present invention, the component undergoes an additional preconditioning step, which comprises subjecting the component to ultrasonic or megasonic energy (hereinafter "ultrasonic/megasonic"). In one embodiment, the ultrasonic/megasonic cleaning is achieved using a coin-type ultrasonic/megasonic device. The ultrasonic/megasonic device is preferably operated at a frequency in the range of 30 kHz to 100 kHz, more preferably in the range of 40 kHz to 80 kHz. In an additional embodiment, the liquid used in the ultrasonic/megasonic device can include Freon, hydrocarbons, or water, with water being the preferred liquid. In another embodiment, the liquid used in the ultrasonic/megasonic device is cascaded away from the component during the ultrasonic/megasonic preconditioning step such that any detached particulates can be removed from the liquid using a filter or other screening mechanism. The filtered liquid is preferably recycled back into the ultrasonic/megasonic device, with fresh liquid added as needed. In one embodiment, once the liquid reaches a predetermined resistivity, all of the liquid is purged and replaced with fresh liquid. In another embodiment of the present invention, the component undergoes a subsequent water soaking and drying. The component can then be heated in an oven and blown off with an inert gas such as nitrogen.

BRIEF DESCRIPTION OF THE DRAWINGS

So that the manner in which the above-recited features, advantages, and objectives of the invention, as well as others that will become apparent, are attained and can be understood in detail, more particular description of the invention briefly summarized above may be had by reference to the embodiments thereof that are illustrated in the drawings that form a part of this specification. It is to be noted, however, that the appended drawings illustrate only several embodiments of the invention and are, therefore, not to be considered limiting of the invention's scope, for the invention may admit to other equally effective embodiments.

DETAILED DESCRIPTION

Figure 1:
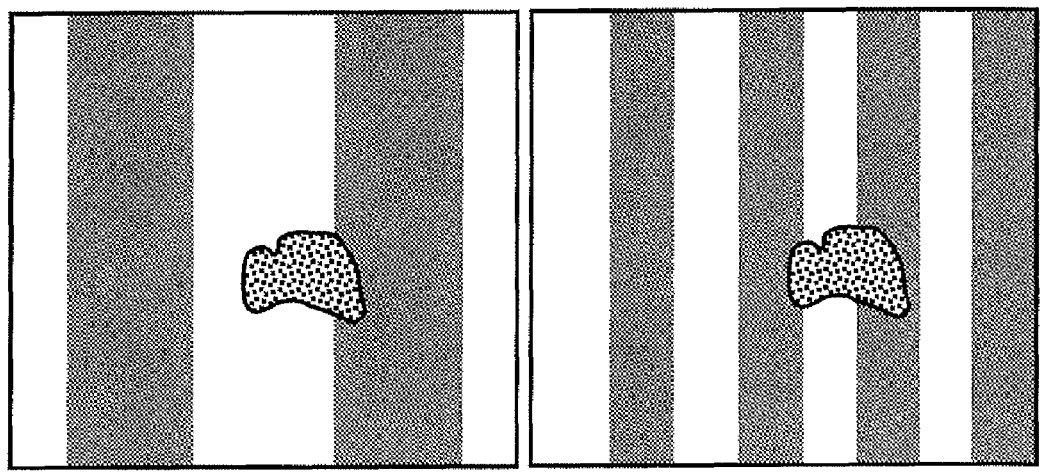
FIG. 1 illustrates the relative impact of semiconductor critical dimension and particulate size.

The present invention provides a method to increase yield and reduce down time in semiconductor fabrication units. Semiconductor manufacturers have been on a pathway to shrinking device geometries by approximately 50% every eighteen months for the last twenty years. As the critical dimensions shrink, which are symbolized by the vertical stripes of FIG. 1, the size of critical defects becomes relatively more important. While the defect shown in FIG. 1 is the same absolute size for both sides, the defect on the right side is relatively large enough to cause catastrophic bridging or blocking failures due to the half-pitch critical dimension. As such, maintaining a defect-free environment near silicon work surfaces has gained increasing importance as demands on yield and cost move higher, and particles that were once acceptable are becoming unacceptable.

Figure 2:
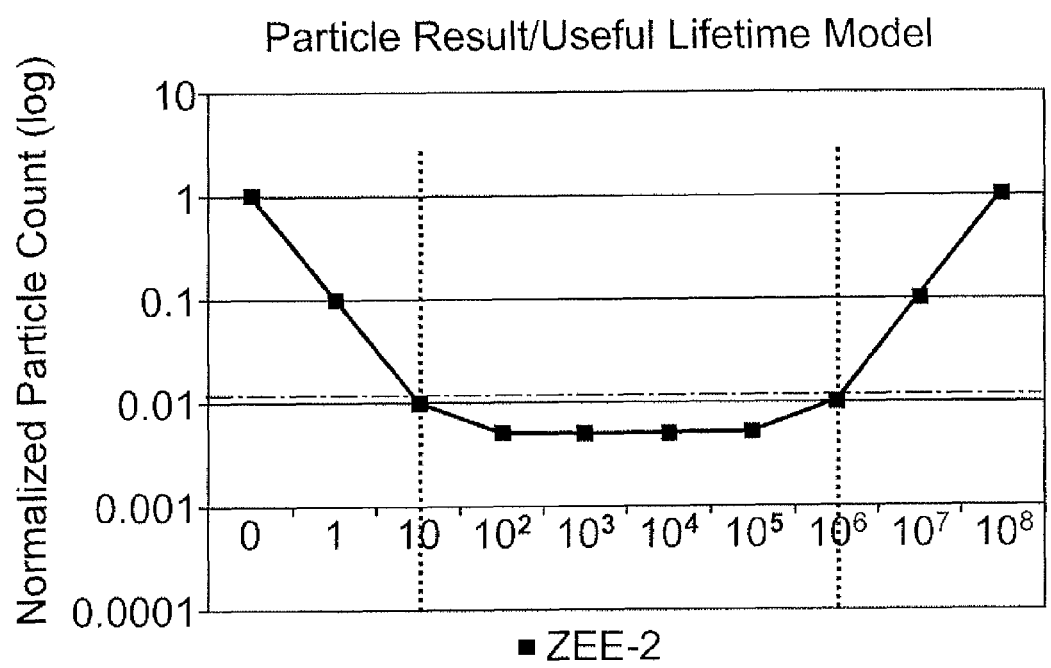
FIG. 2 is a graphical representation of a typical "bath-tub" curve.

As noted early, components manufactured for semiconductor substrate processing equipment tend to show high, defect-driven particulation rates early on in their lifetime, followed by a period of low particulation, then finally by a high failure rate during their later life. FIG. 2 illustrates typical defect rates vs. time on a log-log scale and is an example of a bathtub curve known in the art of Reliability Engineering that follows this general life cycle. The horizontal dashed line represents the maximum acceptable particle count, while the vertical dashed lines represent the useful life of a particular component.

Figure 3:
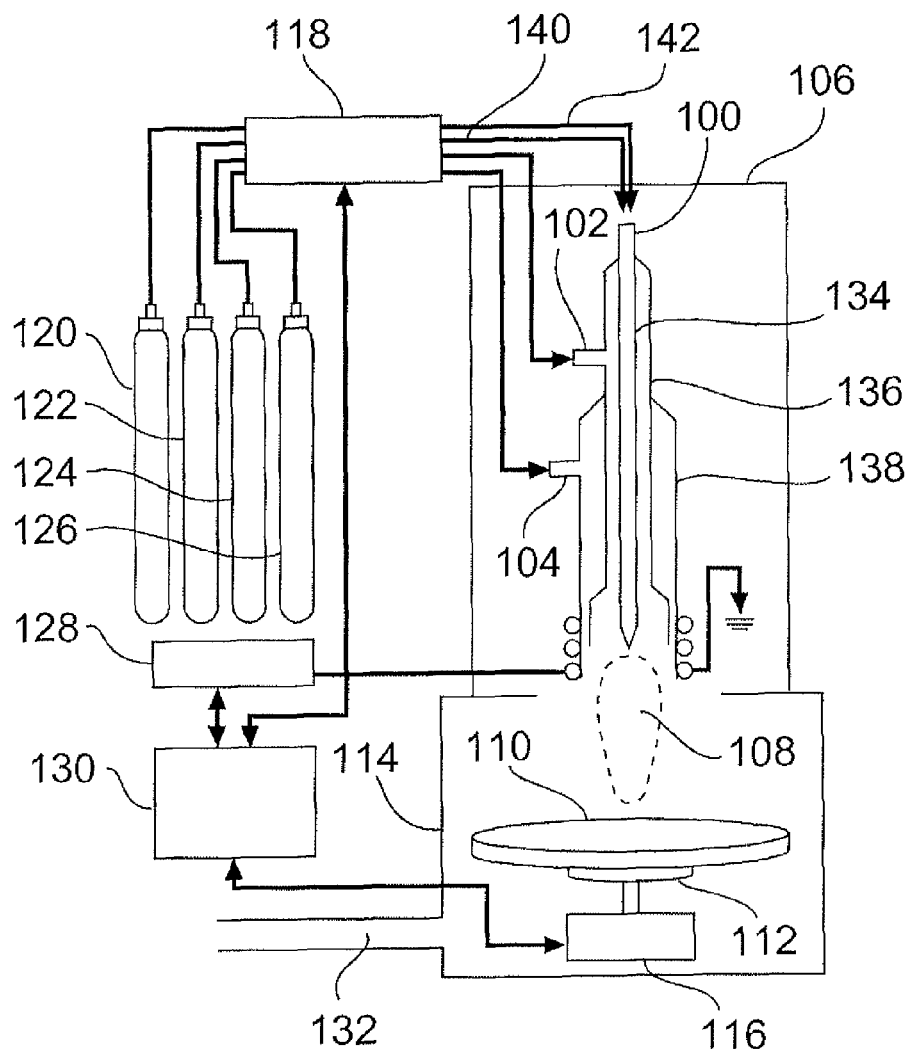
FIG. 3 is a diagram of a system used for preconditioning a fabrication component in accordance with an embodiment of the present invention.

In one embodiment of the present invention, the fabrication component is milled and/or grinded as part of a dry mechanical manufacturing process. The fabrication component then undergoes a first preconditioning step, wherein the fabrication component is subjected to a plasma process. The plasma process etches small particles from the porosity of the fabrication components. In one embodiment, the plasma system is controlled by a CNC system. FIG. 3 shows one embodiment of a reactive atom plasma system that can be used in accordance with the present invention. FIG. 3 shows an inductively-coupled plasma (ICP) torch in a plasma box [106]. The torch consists of an inner tube [134], an outer tube [138], and an intermediate tube [136]. Inner tube [134] has a gas inlet [100] for receiving a stream of reactive precursor gas [142] from a mass flow controller [118]. Gas inlet [100] can also be used for receiving a depositional precursor gas stream [140], or a material to be deposited on the surface of a component. Intermediate tube [136] has a gas inlet [102] for receiving an auxiliary gas from flow controller [118]. Outer tube [138] has a gas inlet [104] for receiving a plasma gas from mass flow controller [118]. Mass flow controller [118] receives the necessary gasses from a number of gas supplies [120], [122], [124], [126], and controls the amount and rate of gasses passed to the respective tube of the ICP torch. The ICP torch generates a plasma discharge [108], which can be used to precondition a component [110] located on a chuck [112] in a component box [114]. In this embodiment, plasma box [106] and component box [114] are separate, allowing the plasma discharge [108] and/or torch to pass at least partially between plasma box [106] and component box [114]. Component box [114] has an exhaust [132] for carrying away any process gases or products resulting from, for example, the interaction of plasma discharge [108] and component [110]. In other embodiments, there may not be separate boxes for the plasma torch and the component.

Chuck [112] in this embodiment is in communication with a translation stage [116], which is adapted to translate and/or rotate component [110] on chuck [112] with respect to plasma discharge [108]. Translation stage [116] is in communication with a computer control system (CNC) [130], such as may be programmed to provide the necessary information or control to translation stage [116] to allow component [110] to be moved along a proper path to achieve a desired removal of particulates of the component. CNC [130] is in communication with an RF power supply [128], which supplies power to the ICP torch. CNC [130] also provides the necessary information to mass flow controller [118].

In one embodiment of the present invention, the fabrication component can be subjected to a second preconditioning step, wherein the fabrication component is subjected to cavitations through the use of ultrasonic/megasonic energy transmitted through a liquid medium. In one embodiment, the fabrication component is subjected to cavitations operating at a frequency of 40 kHz. In a more preferred embodiment, the cavitations operate at a frequency of 80 kHz. Megasonic cleaning uses the piezoelectric effect to enable removal of submicron particles from substrates. A ceramic piezoelectric crystal is excited by high-frequency AC voltage, causing it to vibrate. This vibration generates an acoustic wave that is transmitted through a cleaning fluid, producing controlled cavitation. As the wave passes across the surface of an object, it causes particles to be removed from the material being cleaned.

The difference between ultrasonic and megasonic lies in the frequency that is used to generate the acoustic waves. Ultrasonic uses lower frequencies and produces random cavitation. Megasonic uses higher frequencies at 1000 kHz and produces controlled cavitation.

An important distinction between the two methods is that the higher megasonic frequencies do not cause the violent cavitation effects found with ultrasonic frequencies. This significantly reduces or eliminates cavitation erosion and the likelihood of surface damage to the fabrication component. Parts that would be damaged by ultrasonic frequencies or cavitation effects can often be preconditioned without damage in a megasonic bath using the same solution With ultrasonics, cavitation occurs throughout the tank, and all sides of submerged parts are preconditioned. With megasonics, only the side of the part that is facing the transducer(s) is preconditioned.

Figure 4:
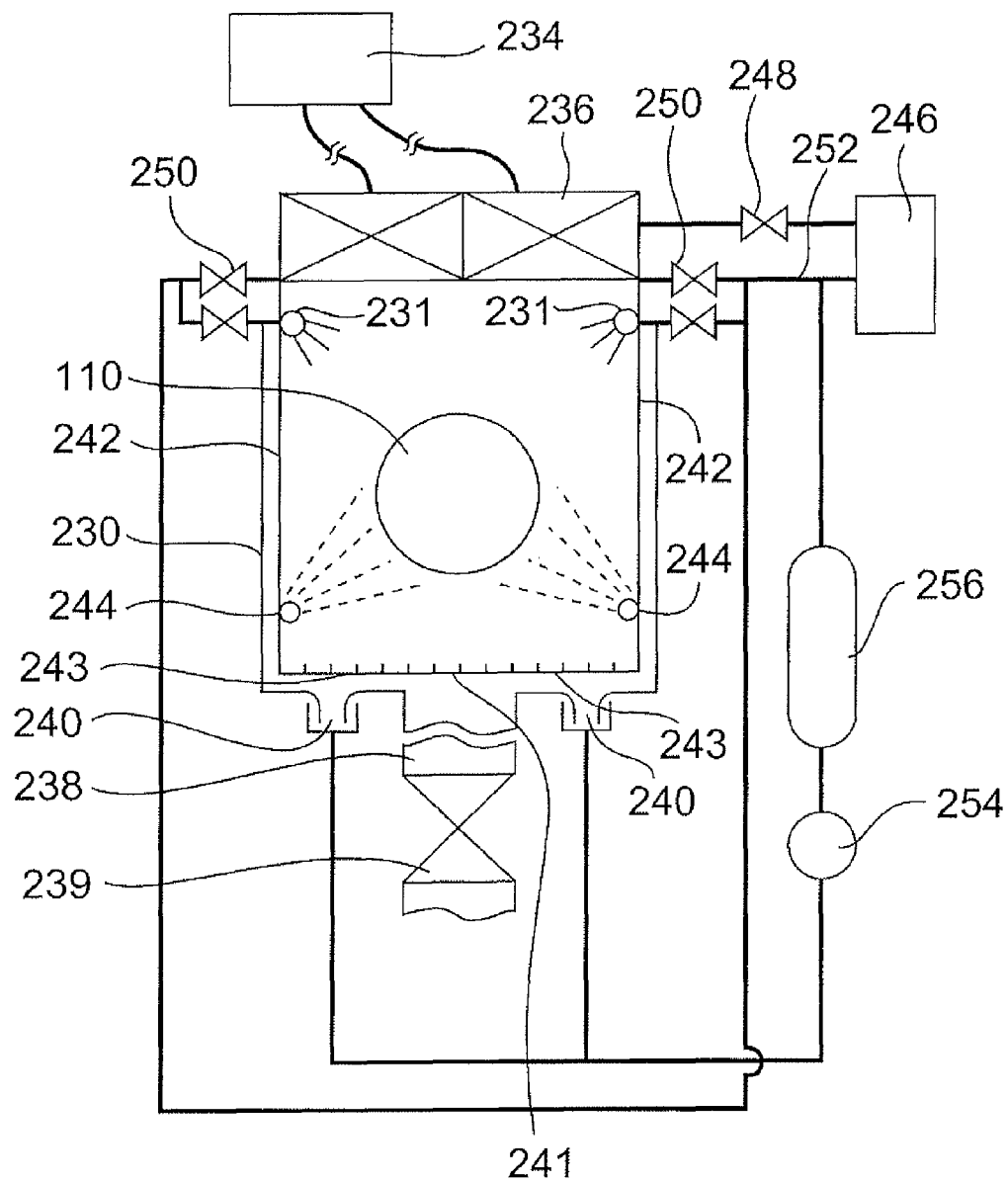
FIG. 4 is a schematic diagram of a system for preconditioning a fabrication component in accordance with an embodiment of the present invention.

FIG. 4 illustrates an apparatus for preconditioning the fabrication component in accordance with an embodiment of the present invention. The apparatus can be divided into two major portions. The first portion generates ultrasonic/megasonic waves for removing unwanted particles on the fabrication component. A second portion is a circulation system for controlling the flow of liquid used to speed up the rate of preconditioning the fabrication component. As described in more detail below, the portions can be used simultaneously or individually, as appropriate.

The first portion of the system in accordance with the present invention includes a container [230] for storing liquid and holding at least one fabrication component [110]. Container [230] is preferably made of quartz. The system further includes an ultrasonic/megasonic generator [234] connected to a transducer [236]. Ultrasonic/megasonic generator [234] generates ultrasonic/megasonic waves for removing particles stuck on, or otherwise securely attached to, the component [110]. Transducer [236] is positioned at the top of container [230] to transfer the ultrasonic/megasonic waves generated by ultrasonic/megasonic generator [234] to container [230].

A drain [238] is located at the bottom of container [230] to drain the liquid out of container [230]. Preferably, a drain valve [239] controls the flow of drain [238]. Drain valve [239], as well as other valves described below, each can be set to an on and an off position. Initially, drain valve [239] is set to the off position to close drain [238]. In an embodiment of the present invention, at least one outlet opening [240] is located at the bottom of container [230].

Container [230] further includes liquid inlets [242] to provide liquid to container [230]. Nozzles [244], connected to liquid inlets [242], spray liquid, e.g., deionized (DT) water, on the surface of the component [110] in container [230]. The liquid is injected into container [230] through liquid inlets [242] and nozzles [244]. Further, nozzles [231] are set at the top of container [230] to perform the same function of nozzles [244].

Liquid inlets [242] can optionally include a plurality of pipes [241] situated along the bottom surface of container [230]. Pipes [241] have a plurality of openings [243] for spraying liquid into container [230]. Alternately, a plurality of pipes can be used to replace liquid inlets [242]. The pipes can be defined along the inner side wall of container [230].

The second portion of the apparatus in accordance with the present invention includes a liquid supply element [246] used to ultimately provide the liquid to container [230]. Liquid supply element [246] provides the liquid to transducer [236]. A first valve [2481] is located between liquid supply element [246] and transducer [236] to control the amount of the liquid flow. First valve [248] allows the liquid to flow to transducer [236] for generating ultrasonic/megasonic wave liquid when first valve [248] is set to the on position.

The liquid in liquid supply element [246] is also fed into container [230] via liquid inlets [242] and nozzles [244]. A plurality of second valves [250], controlling the amount of flow of liquid through liquid inlets [242], are located between liquid inlets [242] and liquid supply element [246]. Second valves [250] allow the liquid to flow when they are set to the on position.

Liquid supply element [246], container [230], and liquid inlets [242] form a flow circulation path. Liquid supply element [246] is connected to liquid inlet [242] by a pipe [252]. Drive means [254], such as a pump, is connected to outlet openings [240] of container [230] using pipe [252]. Preferably, one end of a filter [256] is connected to pump [254] to filter out residue from the liquid. A second end of filter [256] is connected to liquid inlet [242].

An operational sequence of the system of the present invention will now be described. Component [110] is appropriately placed at a predetermined position in container [230]. First and the second valves [248], [250] are set to the on position, providing liquid to transducer [236] and liquid inlets [242]. Further, drain valve [239] for controlling drain [238] is set to the off position. The liquid is injected into container [230] to a desired level through liquid inlets [242], nozzles [244], nozzles [231] and openings [243] if present.

At the same time, ultrasonic/megasonic generator [234] is turned on to generate ultrasonic/megasonic waves. Pump [254] is also turned on. Pump [254] drives the liquid to circulate in the system. Solenoid valve [239] is turned on and the liquid is quickly drained out of container [230] by drain [238]. The aforementioned steps can be repeated to remove unwanted particles on component [110]. The first and second portions of the system can be implemented either individually or concurrently to remove the unwanted particles.

EXAMPLE

Figure 5:
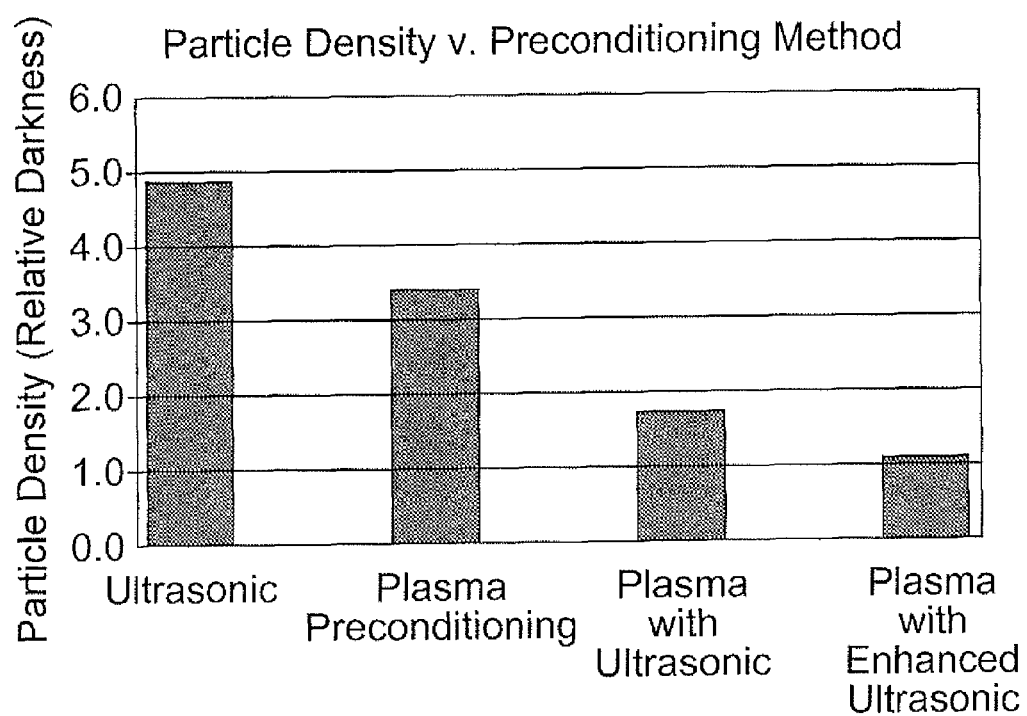
FIG. 5 is a graphical representation of the particle counts of component samples preconditioned using a standard swept ultrasonic method and according to various embodiments of the present invention.

Eight samples of an IDM-defined critical component were used for an investigation of preconditioning techniques. All of these electrodes were manufactured from Poco Graphite's ZEE-2 material, of which two (2) were preconditioned using standard swept 50 kHz ultrasonics, two (2) using the plasma processing described above, two (2) using a combination of plasma processing and standard swept 40 kHz ultrasonics, and two (2) using a combination of plasma processing and the enhanced ultrasonic/megasonic described above. For the two (2) samples undergoing a combination treatment of plasma processing and standard swept 40 kHz ultrasonics, the samples were placed in ultra pure water (having a resistivity of 17 MΩ) that was at 140° F. The component samples were exposed to ultrasonic energy operating at a frequency of 40 kHz for approximately 30 minutes. The energy was then turned off to allow the components to soak for an additional 30 minutes prior to drying with clean, dry air. The dried component samples were then placed in an oven operating at 215° F. for approximately one (1) hour and then subsequently heated for an additional two (2) hours at 425° F. The component samples were removed from the oven and blown off with nitrogen before being double vacuum bagged for storage prior to testing. The process was the same for the two samples that were preconditioned with plasma processing and enhanced ultrasonic/megasonic energy with the exception that they were exposed to a second round of ultrasonic energy operating at 80 kHz rather than 40 kHz. The eight component samples were then measured for remaining particulates using a tape method in comparison to a gray scale. FIG. 5 is a graphical representation of the results.

Figure 6:
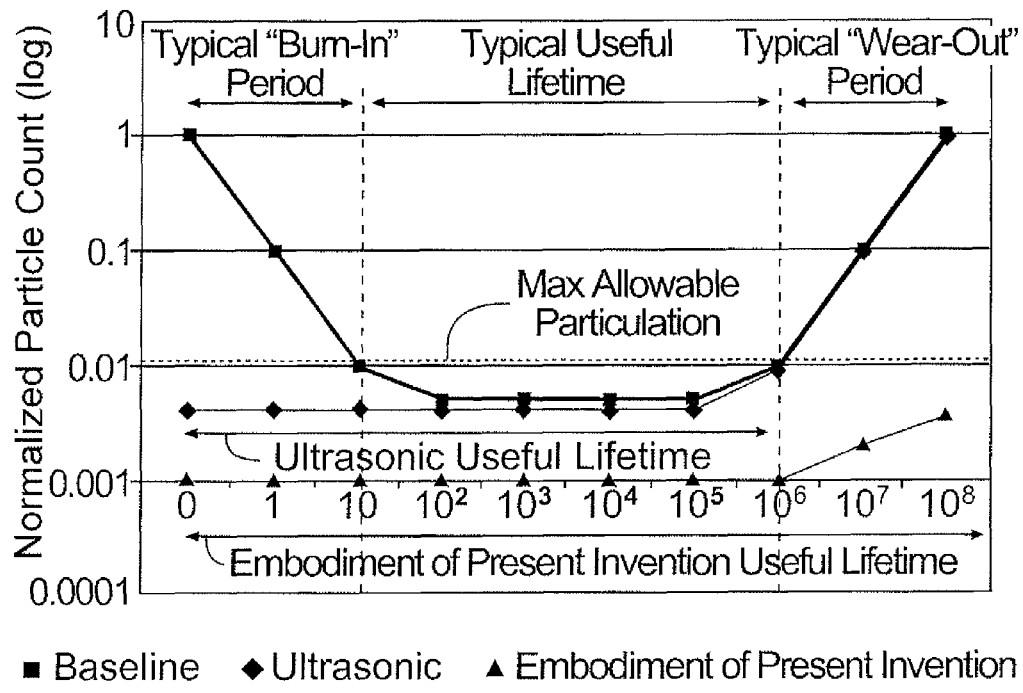
FIG. 6 is a graphical representation of a model developed to predict useful lifetimes for fabrication components based upon particulate counts.

FIG. 6 is a graphical representation of a model developed to predict useful lifetimes for fabrication components based upon particulate counts. The data collected from the tape test was used to predict the expected lifetime values for a fabrication component preconditioned in accordance with the aforementioned examples. The enhanced ultrasonic samples and samples preconditioned in accordance with an embodiment of the present invention indicate that no "seasoning" would be necessary as the starting particle counts for each are well below the allowable levels. However, the fabrication component made in accordance with an embodiment of the present invention is not only superior at the front end of the life cycle, but it also unexpectedly maintains its usefulness longer during the "wear-out" phase period. This unexpected result not only decreases downtime at the front end of replacement, but it also increases the lifetime of the component thereby reducing the overall downtime of the fabrication unit.

As will be readily apparent to those skilled in the art, the present invention may easily be produced in other specific forms without departing from its spirit or essential characteristics. The present embodiments are, therefore, to be considered as merely illustrative and not restrictive, the scope of the invention being indicated by the claims rather than the foregoing description, and all changes which come within the meaning and range of equivalence of the claims are therefore intended to be embraced therein.

The invention claimed is:

1. A method for preconditioning a surface of a graphite component to minimize particulation from the component during subsequent use as a part in a semiconductor fabrication unit, the method comprising the steps:
   providing the graphite component that is shaped to be subsequently integrally incorporated into the semiconductor fabrication unit;
   providing a plasma processing chamber having a plasma torch, wherein the plasma torch is constructed and arranged to generate a plasma discharge at a rate of discharge;
   placing the graphite component within the plasma processing chamber, wherein the plasma torch is directed at the graphite component;
   subjecting the graphite component to reactive atom plasma processing with the plasma discharge from the plasma torch, such that substantially all graphite particulates located on the surface of the graphite component are removed from the surface; and
   controlling the rate of discharge from the plasma torch through the use of a computer numerical control system,
   removing the graphite component from the plasma processing chamber; and
   providing the graphite component for subsequent use in the semiconductor fabrication unit.

2. The method of claim 1, further comprising subjecting the graphite component to a subsequent preconditioning step, wherein the subsequent precondition step comprises:
   placing the graphite component in a container filled with a liquid medium, wherein the container is in communication with an ultrasonic/megasonic generator connected to a transducer; and
   subjecting the graphite component to energy waves, wherein the energy waves have a frequency.

3. The method of claim 2 wherein the frequency of the energy waves is 40 kHz.

4. The method of claim 2 wherein the frequency of the energy waves is 80 kHz.

5. The method of claim 2 wherein the liquid medium is selected from the group consisting of Freon, hydrocarbons, and water.

6. The method of claim 2, further comprising cascading the liquid medium away from the graphite component and out of the container.

7. The method of claim 6, further comprising filtering the liquid medium to remove one or more detached particulates and provide a filtered liquid medium, and recycling at least a portion of the filtered liquid medium back into the container containing the graphite component.

8. The method of claim 7, further comprising adding a new portion of the liquid medium to the filtered liquid medium.

9. The method of claim 6, further comprising soaking the component in water, drying the component, heating the component in an oven, and blowing the component off with an inert gas.

10. A method for preconditioning a surface of a densified silicon carbide component to minimize particulation from the component during subsequent use as a part in a semiconductor fabrication unit, the method comprising the steps:
    providing a densified silicon carbide component that is shaped to be subsequently integrally incorporated into the semiconductor fabrication unit;
    providing a plasma processing chamber having a plasma torch and a discharge direction, wherein the plasma torch is constructed and arranged to generate a plasma discharge at a rate of discharge;
    placing the densified silicon carbide component within the plasma processing chamber, wherein the plasma torch is directed at the densified silicon carbide component;
    subjecting the densified silicon carbide component to reactive atom plasma processing with the plasma discharge from the plasma torch; and
    controlling the rate of discharge from the plasma torch through the use of a computer numerical control system,
    removing the densified silicon carbide component from the plasma processing chamber; and
    providing the densified silicon carbide component for subsequent use in the semiconductor fabrication unit.

11. The method of claim 10, wherein the densified silicon carbide component was created by a process comprising:
    supplying a porous preform formed entirely from silicon carbide and having an open porosity, wherein the porous preform is formed from a near-net shape graphite article;
    filling a substantial number of pores within the porous silicon carbide preform with a carbon precursor to produce a filled silicon carbide preform;
    heating the filled silicon carbide preform at a preselected pyrolysis temperature to produce a carbonaceous porous structure within the pores of the porous silicon carbide preform; and
    contacting the carbonaceous porous structure with silicon so that the silicon diffuses through the carbonaceous porous structure and reacts with carbon contained within the pores of the porous silicon carbide preform to produce a second phase of silicon carbide within the pores of the porous silicon carbide preform, such that the resulting densified silicon carbide article is densified with silicon carbide and exhibits lower porosity compared to the porous silicon carbide preform and is a SiC—SiC composite.

* * * * *

UNITED STATES PATENT AND TRADEMARK OFFICE
CERTIFICATE OF CORRECTION

PATENT NO.        : 8,721,906 B2                                        Page 1 of 1
APPLICATION NO.   : 12/997205
DATED             : May 13, 2014
INVENTOR(S)       : Wayne Hambek It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 467 days.

Signed and Sealed this

Twenty-ninth Day of September, 2015

Michelle K. Lee
*Director of the United States Patent and Trademark Office*